United States Patent [19]
Rao

[11] Patent Number: 5,815,456
[45] Date of Patent: Sep. 29, 1998

[54] MULTIBANK — MULTIPORT MEMORIES AND SYSTEMS AND METHODS USING THE SAME

[75] Inventor: G.R. Mohan Rao, Dallas, Tex.

[73] Assignee: Cirrus Logic, Inc., Fremont, Calif.

[21] Appl. No.: 666,814

[22] Filed: Jun. 19, 1996

[51] Int. Cl.[6] .................................. G11C 8/00; G11C 7/00
[52] U.S. Cl. .......................... 365/230.03; 365/230.08; 365/230.09; 365/189.05
[58] Field of Search ..................... 365/230.02, 230.03, 365/230.08, 230.09, 189.02, 189.05

[56] References Cited

U.S. PATENT DOCUMENTS

| | | | |
|---|---|---|---|
| 4,347,587 | 8/1982 | Rao | 365/230.09 |
| 4,494,222 | 1/1985 | White et al. | 365/230.02 |
| 4,893,281 | 1/1990 | Hashimoto | 365/230 |
| 4,987,559 | 1/1991 | Miyauchi et al. | 365/189.04 |
| 5,121,360 | 6/1992 | West et al. | 365/370 |
| 5,305,284 | 4/1994 | Iwase | 365/238.5 |
| 5,319,603 | 6/1994 | Watanabe et al. | 365/230.05 |
| 5,319,755 | 6/1994 | Farmwald et al. | 395/325 |
| 5,377,154 | 12/1994 | Takasugi | 365/221 |
| 5,390,139 | 2/1995 | Smith et al. | 365/49 |
| 5,408,129 | 4/1995 | Farmwald et al. | 257/692 |
| 5,412,613 | 5/1995 | Galbi et al. | 365/230.03 |
| 5,430,676 | 7/1995 | Ware et al. | 365/189.02 |
| 5,434,817 | 7/1995 | Ware et al. | 365/189.01 |
| 5,502,675 | 3/1996 | Kohno et al. | 365/230.03 |
| 5,506,810 | 4/1996 | Runas | 365/230.03 |
| 5,537,353 | 7/1996 | Rao et al. | 365/230.02 |
| 5,568,431 | 10/1996 | Rao | 365/230.03 |
| 5,570,320 | 10/1996 | Runas | 365/230.03 |
| 5,598,374 | 1/1997 | Rao | 365/230.03 |
| 5,600,608 | 2/1997 | Rao | 365/230.08 |
| 5,613,094 | 3/1997 | Khan et al. | 365/230.03 |
| 5,636,174 | 6/1997 | Rao | 365/230.03 |

*Primary Examiner*—David C. Nelms
*Assistant Examiner*—Trong Phan
*Attorney, Agent, or Firm*—James J. Murphy; Steven A. Shaw

[57] ABSTRACT

A memory comprising a first memory bank 201 and a second memory bank 201 includes a plurality of data input/output terminals, a first subset of the plurality of data input/output terminals for accessing the first memory bank and a second subset of the plurality of data input/output terminals for accessing the second memory bank.

22 Claims, 6 Drawing Sheets

MULTIBANK — MULTIPORT MEMORIES AND SYSTEMS AND METHODS USING THE SAME

CROSS-REFERENCE TO RELATED APPLICATION

The following co-pending and co-assigned applications contain related information and are hereby incorporated by reference:

U.S. patent application Ser. No. 08/666,815 (Attorney's Docket No. 2836-P030US/0443-VPRT-US), entitled "DUAL PORT MEMORIES AND SYSTEMS AND METHODS USING THE SAME," filed simultaneously with this application; and U.S. patent application Ser. No. 08/521,867 (Attorney's Docket No. 2836-P036US/0344-VPRT-US), entitled "LOW PIN COUNT—WIDE MEMORY DEVICES AND SYSTEMS AND METHODS USING THE SAME," allowed Apr. 12, 1996 now U.S. Pat. No. 5,537,353.

TECHNICAL FIELD OF THE INVENTION

The present invention relates in general to electronic memories and in particular to multibank-multiport memories and systems and methods using the same.

BACKGROUND OF THE INVENTION

A typical processing system includes a central processing unit (CPU), a display controller coupled to the CPU by a CPU local bus (directly and/or through core logic), a system memory coupled to the CPU local bus through core logic, a frame buffer memory coupled to the display controller via a peripheral local bus (e.g., PCI bus), peripheral circuitry (e.g., clock drivers and signal converters, display driver circuitry), and a display nit.

The CPU is the system master and generally provides overall system control in conjunction with the software operating system. Among other things, the CPU communicates with the system memory, holding instructions and data necessary for program execution, normally through core logic. Typically, the core logic is two to seven chips, with one or more chips being "address and system controller intensive" and one or more other chips being "data path intensive." The CPU also, in response to user commands and program instructions, controls the contents of the graphics images to be displayed on the display unit by the display controller.

As CPUs become faster, the need for faster memories becomes more critical. Short access time particularly becomes critical during operations, such as numerical calculations, where the CPU requires numerous random accesses from memory. Further, during operations such as display refresh/update, where substantial amounts of data are streamed from memory, short access times become important to insure that the cumulative time required to refresh each frame is minimized. In each case, minimizing memory access time improves performance since system resources, such as the buses and core logic are freed for use on additional tasks.

Currently, the system and frame buffer memories are normally constructed from dynamic random access memories (DRAMs) in order to take advantage of the high cell density and low power consumption characteristics of such memory devices. The trade-off however is in speed, especially when DRAMs are compared with static random access memories (SRAMs). Thus, in order to continue to take advantage of the lower power consumption and higher bit density characteristics of DRAMs, various techniques have been developed at the system level in order to overcome DRAM speed deficiencies. These techniques are neither ideal nor directly address the problem of memory access speed at its root cause at the device level.

Cache memory is often used to improve access to data by the CPU. In this case, when data is required by the CPU from the system memory, entire blocks of data of a given spacial and/or temporal locality are retrieved from system memory and stored in a fast SRAM cache memory. Accesses by the CPU from cache can then be made with a shorter access time. Still, between 5 to 10 percent of the time, depending on the cache hit rate, the CPU still has to directly access the DRAMs of the system memory. In other systems, multiple memory banks and interleaved accesses are used to improve data access times. These systems normally require implementation of a more complicated timing scheme and often require the use of significantly more memory.

Another problem with presently available semiconductor memory devices, including both DRAMs and SRAMs, is the limited flexibility of the data port. In conventional semiconductor memories, the CPU and/or core logic can, during a given access cycle, either read or write through the data port, but cannot read through some of the pins of the data port and read from other pins of the data port. This limitation often prevents achieving the optimal and/or fastest accessing of the memory device, especially when words of less than the full data port width are consistently operated upon.

Thus, the need has arisen for devices, systems and methods which optimize accesses through the data port. Such devices should include non-volatile and volatile memories. In the case of DRAMs, the ability to optimize accesses should allow for an improvement in speed.

SUMMARY OF THE INVENTION

According to a first embodiment of the principles of the present invention, a memory is provided which includes first and second memory banks. A plurality of data input/output terminals are provided, a first subset of the plurality of data input/output terminals for accessing the first memory bank and a second subset of the plurality of data input/output terminals for accessing the second memory bank.

According to a second embodiment of the principles of the present invention, a memory is provided which includes a plurality of memory banks. Each memory bank includes an array of memory cells and addressing circuitry for selecting a cell within the array for access in response to a received address. A type of access to a given bank is selected in response to a read-write bit received at a control port of the memory. The memory also includes a plurality of terminals for accessing data from addressed ones of the cells, a selected subset of the terminals exchanging data with a corresponding one of the banks.

According to a third embodiment of the principles of the present invention, an integrated circuit is provided which includes a first memory bank including an array of dynamic random access memory cells and decoder circuitry for selecting at least one of the cells in the array for access in response to at least one address bit. A second memory bank is included which has an array of dynamic random access memory cells and decoder circuitry for selecting at least one of the cells in the array for access in response to at least one address bit. The integrated circuit further includes input/output circuitry coupled to the first and second memory banks. The input/output circuitry includes a plurality of address terminals for receiving address bits addressing at least one of the banks. The input/output circuitry additionally includes a plurality of data terminals, first selected ones of the plurality of data terminals for exchanging data with addressed ones of the cells of the first bank and second selected ones of the data terminals for exchanging data with addressed ones of the cells of the second bank. A first control terminal is provided for receiving a control signal controlling reading and writing with the first bank and a second control terminal for receiving a control signal controlling reading and writing with the second bank.

The principles of the present invention are also embodied in methods of operating memories. In one such embodiment, a method is provided for operating a memory including first and second memory banks and a plurality of data input/output terminals. The method includes a step of accessing the first memory bank through a first subset of the plurality of data input/output terminals. A step of substantially simultaneously accessing the second bank through a second subset of the plurality of the data input/output terminals.

Multiport memories and systems and methods using the same show substantial advantages over the prior art. Among other things, such devices, systems and methods allow optimization data accesses through the data port. The principles of the present invention can be applied equally well to non-volatile and volatile memories. In the particular case of DRAMs, the ability to optimize accesses allow for an improvement in speed by allowing simultaneous reads and writes through the data port in the corresponding banks, as desired.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1A:
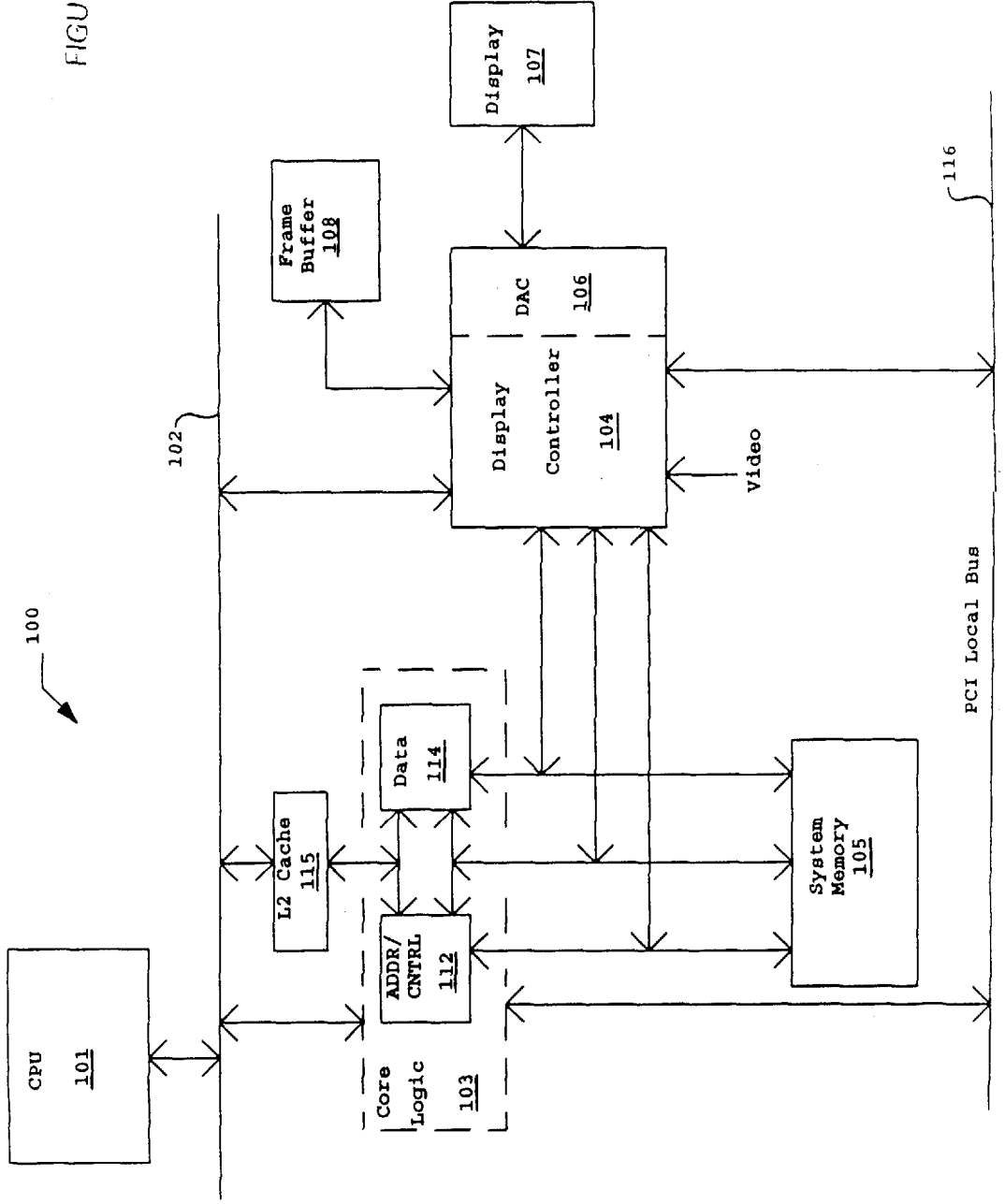
FIGS. 1A and 1B are high level functional block diagrams of exemplary processing systems embodying the principles of the present invention.

The principles of the present invention and their advantages are best understood by referring to the illustrated embodiment depicted in FIGS. 1–4 of the drawings, in which like numbers designate like parts. While memory devices embodying the principles of the present invention are useful in a wide number of applications, for purposes of illustration, such memory devices will be described in conjunction with a basic processing system architecture typically employed in personal computers.

FIG. 1 is a high level functional block diagram of a portion of a processing system 100. System 100 includes a central processing unit 101, a CPU local bus 102, core logic 103, a display controller 104, a system memory 105, a digital to analog converter (DAC) 106, frame buffer 108, a display device 107.

CPU 101 is the "master" which controls the overall operation of system 100. Among other things, CPU 101 performs various data processing functions and determines the content of the graphics data to be displayed on display unit 107 in response to user commands and/or the execution of application software. CPU 101 may be for example a general purpose microprocessor, such as an Intel Pentium™ class microprocessor or the like, used in commercial personal computers. CPU 101 communicates with the remainder of system 100 via CPU local bus 102, which may be for example a special bus, or a general bus (common in the industry).

Core logic 103, under the direction of CPU 101, controls the exchange of data, addresses, control signals and instructions between CPU 101, display controller 104, and system memory 105. Core logic 103 may be any one of a number of commercially available core logic chip sets designed for compatibility with the remainder of the system, and in particular with CPU 101. One or more core logic chips, such as chip 112 in the illustrated system, are typically "address and system controller intensive" while one or more core logic chips, such as chip 114 in FIG. 1, are "data intensive." Address intensive core logic chip 112 generally: interfaces CPU 101 with the address path of CPU bus 102; maintains cache memory, including the cache tags, set associative cache tags and other data necessary to insure cache coherency; performs cache "bus snooping"; generates the control signals required for DRAMs in the system memory or cache; and controls general management transactions. Data intensive chip 114 generally: interfaces CPU 101 with the data path of CPU bus 102; issues cycle completion responses to address chip 112 or CPU 101; may abort operations if their cycles are incomplete; and arbitrates for the data path of bus 102.

CPU 101 can directly communicate with core logic 103 or through an external (L2) cache 115. L2 cache 115 may be for example a 256K Byte fast SRAM device(s). It should be noted that CPU 101 can also include on-board (L1) cache, typically up to 16 kilobytes.

In addition to the conventional functions described above, core logic 103 and/or CUP 101 provide the additional functions described below, either through software programming (such as in the core logic 103) or hardware modification.

Display controller 104 may be any one of a number of commercially available VGA display controllers. For example, display controller 104 may be one of the Cirrus Logic CL-GD754x series of display controllers. The structure and operation of such controllers is described in *CL-GD754x Application Book,* Rev 1.0, Nov. 22, 1994, and *CL-GD7542 LCD VGA Controller Preliminary Data Book,* Rev. 1.0.2, June 1994, both available from Cirrus Logic, Inc., Fremont, Calif., and incorporated herein by reference.

Display controller 104 may receive data, instructions and/or addresses from CPU 101 either through core logic 103 or directly from CPU 101 through CPU local bus 102. Data, instructions, and addresses are exchanged between display controller 104 and system memory 105 through core logic 103. Further, addresses and instructions may be exchanged between core logic 103 and display controller 104 via a local bus 116 which may be for example a PCI local bus. Generally, display controller 104 controls screen refresh, executes a limited number of graphics functions such as line draws, polygon fills, color space conversion, display data interpolation and zooming, and video streaming, and handles other ministerial chores such as power management. Most importantly, display controller 104 controls the raster of pixel data from frame buffer 108 to display unit 107 during screen refresh and interfaces CPU 101 and frame buffer 108 during display data update. Video data may be directly input into display controller 104.

Digital to analog converter 106 receives digital data from controller 104 and outputs the analog data to drive displays 107a and 107b (when used) in response. In the illustrated embodiment, DAC 106 is integrated with display controller 104 onto a single chip, preferably including a RAMDAC and phase locked loop (PLL). Depending on the specific implementation of system 100, DAC 106 may also include a color palette, YUV to RGB format conversion circuitry, and/or X- and Y- zooming circuitry, to name a few options. Displays 107 may be for example a CRT unit, a liquid crystal display, electroluminescent display, plasma display, or other type of display device which displays images on a screen as a plurality of pixels. It should also be noted that in alternate embodiments, "display" 107 may be another type of output device such as a laser printer or similar document view/print appliance.

The data paths in system 100 will vary with each design. For example, system 100 may be a "64-bit" or "72-bit" system. Assume for discussion purposes that a 64-bit system is chosen. Then, each of the data connections, including the data paths of CPU bus 102 and PCI bus 116, the data paths through core logic 103 to system memory 109 and display controller 104, and the data interconnection between display controller 104 and frame buffer 108, are all 64 bits wide. It should be noted that the address interconnections will vary depending on the size of the memory and such factors as the need to support data byte select, error detection correction, and virtual memory operations.

Figure 1B:
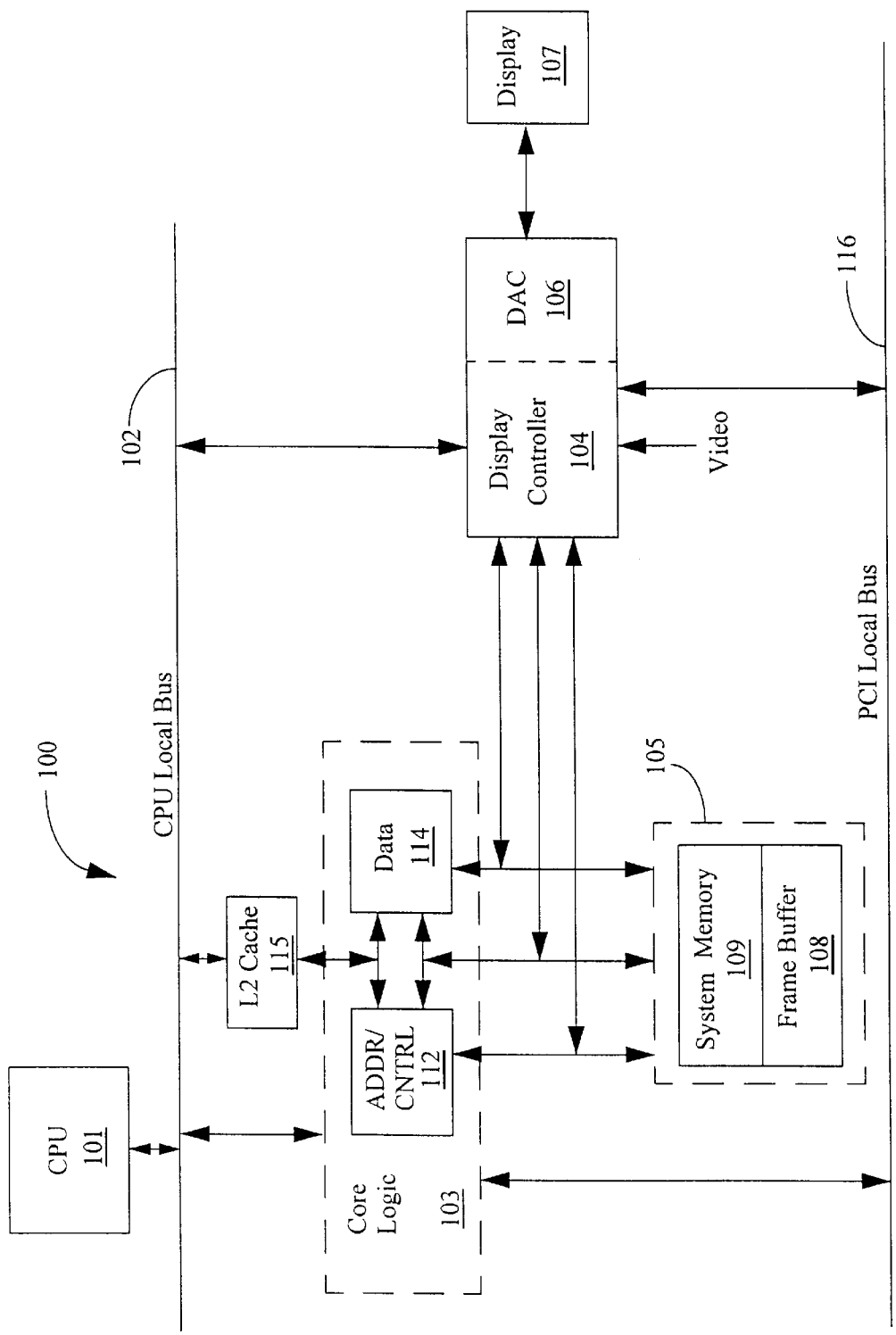

FIG. 1B is an alternate system architecture of system 100 to which the principles of the present invention may advantageously applied. In this example, memory 105 is a "unified" memory system since the system memory 109 and frame buffer 108 are co-located in a single integrated circuit or bank of integrated circuits. This is in contrast to those systems in which the frame buffer is separate and apart from the system memory and interfaces with the remainder of the system through the display controller. System memory 109 again is preferably a traditional system memory which stores data, addresses, and instructions under the command of CPU 101 as required for executing various processing functions and applications programs. As in traditional systems, the frame buffer 108 stores the pixel data required to generate the required images on the screen of display unit 107.

Figure 2:
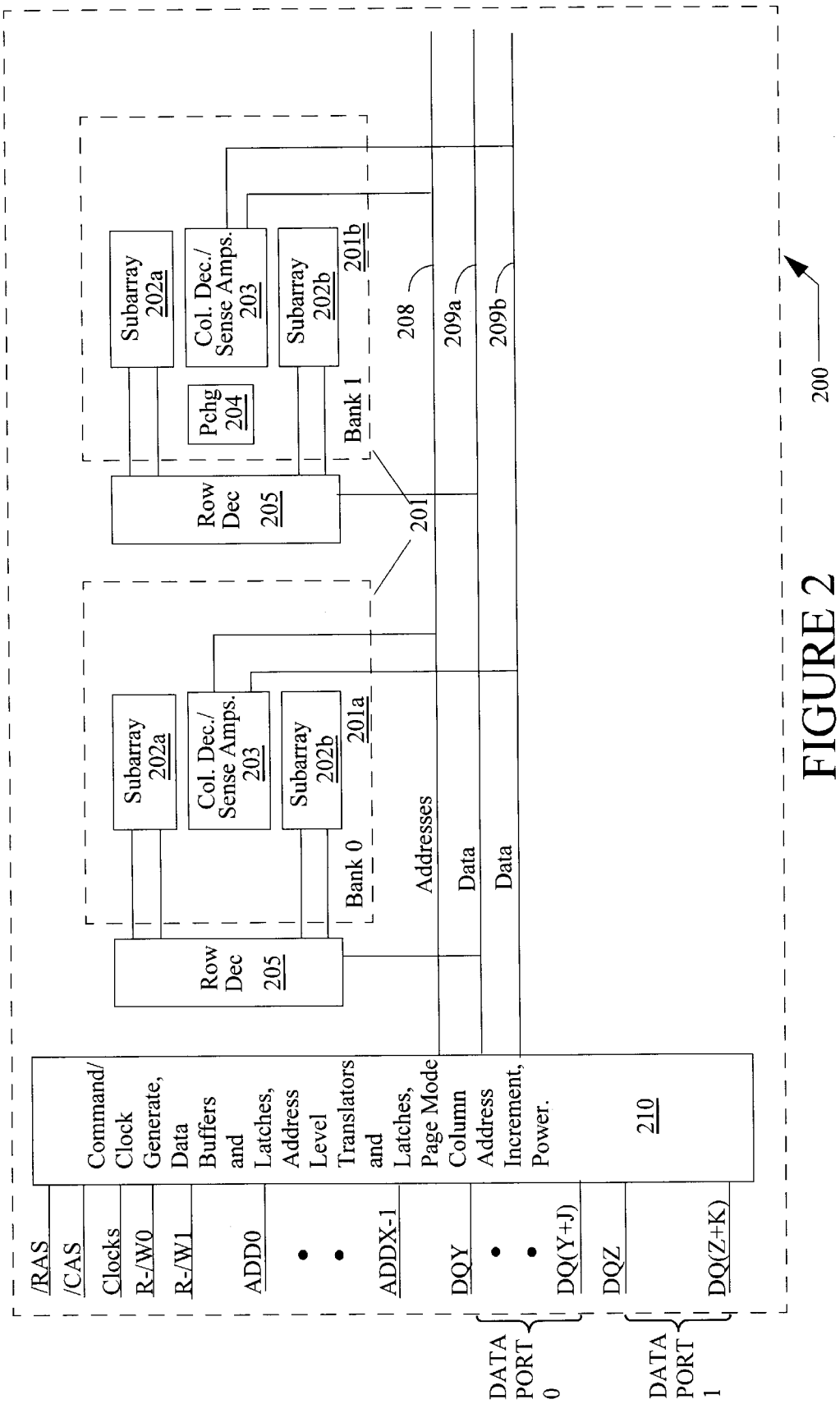
FIG. 2 is a more detailed functional block diagram of a multibank-multiport memory subsystem according to one embodiment of the principles of the present invention.

FIG. 2 is a high level functional block diagram of a memory subsystem (device) 200 embodying the principles of the present invention. Memory 200 may be used in any one of a number of applications, for example, system memory 105 in system 100 as depicted in FIG. 1A or unified memory 105 shown in the system of FIG. 1B. In the preferred embodiment, memory subsystem 200 is fabricated as a single integrated device (chip), although the present inventive principles are not limited to such single chip embodiments.

In the preferred embodiment, memory subsystem 200 includes two internal memory banks 201a and 201b, collectively referred to as memory banks 201, labelled Banks 0–Bank 1, for discussion purposes. Alternatively, the number of multiple banks 201 may be greater than two. The role of multiple banks will be discussed further below in conjunction with the discussion of multiple (split) data ports.

In illustrated embodiment, each memory bank 201 includes two subarrays 202a and 202b of dynamic random access memory (DRAM) cells, the entire array arranged as M number of rows and N number of columns. The subarrays 202a and 202b of each bank 201 are associated with column decoder—sense amplifier circuitry 203. In one embodiment of memory subsystem 200, subarrays 202a and 202b of each bank 201 are coupled to the corresponding sense amplifiers in an open-bitline arrangement. In this instance, each subarray 202a would contain the "true" half-bitlines $BL_M$ and subarray 202b correspondingly would contain the complimentary half-bitlines $/BL_M$ for the corresponding bank 201. In another embodiment, the bitlines of each subarray 202 may be organized in a folded bitline arrangement, with a given bitline $BL_M$ and its complement $/BL_M$ disposed in the same subarray 202.

The wordlines associated with the rows of cells in each subarray 202 are coupled to and controlled by row decoder circuitry 205. Column addresses are presented to the column decoders of circuit blocks 203 and row addresses to the blocks of row decoder circuitry 205 via an internal address bus 208. Column and row addresses may be transmitted on bus 208 on dedicated (non-multiplexed) row and column address lines or on a single set of lines in a multiplexed fashion. Additional, independent address busses may be provided for each of the multiple banks 201.

Data is exchanged between input/output and control circuitry 210 and the column decoder of bank 201a via independent data lines (bus) 209a. Similarly, data is exchanged between input/output and control circuitry 210 and the column decoder of bank 201b via independent data lines bus 209b. Independent sets 209a and 209b of data lines advantageously allow for independent simultaneous accesses to banks 201a and 201b. Among other things, data can be written to both banks simultaneously in a single /RAS cycle, read from both banks in a single /RAS cycle or read from one bank and written to the other bank in a single /RAS cycle.

Data, addresses clocks, and control signals are exchanged between memory subsystem 201 and associated external devices through input/output and control circuitry 210. In system 100, these signals may be received from core logic 103. Among other things, circuitry 210 includes conventional clock generation circuitry for generating the clocks needed drive the dynamic circuitry of memory 200. Input/output circuitry 210 further includes conventional data buffers and latches, address level translators and address latches, page mode column incrementation circuitry and circuitry for controlling power distribution.

Preferably, memory subsystem 200 is designed for operation with a multiplexed address bus 208. In the illustrated embodiment, subsystem 201 includes a X-bit wide address port labelled lines ADD0-ADD(X-1). The number of address lines X will vary from embodiment to embodiment depending on such factors as the capacity of the device, the word width, and the number of bank select bits. When required, the bank select bits are assumed to be presented as part of each row address, although this is not a firm requirement. In the preferred embodiment, addresses presented to the address port are used to access both banks in those instances where both banks are being simultaneously being accessed. In embodiments where all banks 201 are always accessed simultaneously, the bank select bit(s) may be eliminated. Alternatively, multiple address ports may be provided to allow independent addressing of each bank in the multiple bank system.

Along with the addresses, reads and writes are controlled by conventional DRAM control signals presented to I/O and control circuitry 210. In the preferred embodiment, both banks are controlled by a common row address strobe /RAS and a column address strobe /CAS. Alternatively, each bank can be controlled by an independent set of /RAS and /CAS signals. Circuitry 210 may also receive one or more clocks, including a master clock and associated clock enable signal, if memory 200 is a synchronous DRAM. In the preferred embodiment, accesses to Bank 0 are controlled by a read-/write bit R-/W0 and to Bank 1 by an independent read-/write bit R-/W1.

Some of the fundamental principles of DRAM construction and operation are described in: "*A 5-volt Only 64 k DRAM*", L. S. White, N. H. Hong, D. J. Redwine, and G. R. Mohan Rao, International Solid State Circuit Conference 1980, Digest of Technical Papers, pp. 230–231; "A 64-k Dynamic RAM Needs Only One 5-volt Supply to Outstrip 16 k Parts", G. R. Mohan Rao and John Hewkin, Electronics, Sep. 28, 1978, pp. 109–116; "*A 1 Mb DRAM With Design-For-Test Functions,*" J. Neal, B. Holland, S. Inoue, W. K. Loh, H. McAdams and K. Poteet, International Solid State Circuit Conference 1986, Digest of Technical Papers, pp. 264–265; "*A 4 Mb DRAM With Half Internal-Voltage Bitline Precharge*", International Solid State Circuit Conference 1986, Digest of Technical Papers, pp. 270–271; "*A Full Bit Prefetch Architecture For Synchronous DRAMs*", T. Sunaga, K. Hosokawa, Y. Nakamura, M. Ichinoise, A Moriwaki, S. Kakimi and N. Kato, IEEE Journal of Solid State Circuits, Vol 30., No. 9, September 1995, pp. 994–1005; and "*DRAM Macros For ASIC Chips*", IEEE Journal of Solid State Circuits, Vol 30., No. 9, September 1995, pp. 1006–1014, each incorporated herein by reference.

According to the principles of the present invention, data is exchanged with memory 200 through a data port which is split into multiple data ports for independently supporting accesses to each of the multiple memory banks 201. In the illustrated embodiment where two banks 201a and 201b are provided, the data port is split into two. Data inputs DQY to DQ(Y+J), together labelled DATA PORT 0, along with data lines 209a, support accesses to memory bank 201a. Similarly data inputs DQZ to DQ(Z+K), together labelled DATA PORT 1, along with data lines 209b support accesses to memory bank 201b.

The width of DATA PORT 0 and DATA PORT 1 will vary from embodiment to embodiment, depending on such factors as the number of available pins on the package and/or the organization of the device. For instance, memory 200 could be a by 16, by 32 or by 64 device. For discussion purposes assume that memory device is a by 64 device and that each data port is 32-bits wide. Preferably the width of DATA PORT 0 is equivalent to that of DATA PORT 1, but this is also not a fixed requirement.

The use of multiple (split) data ports and multiple banks according to the principles of the present invention provide substantial advantages over the prior art. Specifically, the CPU and/or core logic are allowed increases flexibility when accessing memories, such as memory 200. In one instance, a 64-bit write can be performed by simultaneously writing 32-bit words using both 32-bit wide Data Port 0 and Data Port 1 to the corresponding addresses 32-bit locations in Banks 201a and 201b respectively. Similarly, simultaneous 32-bit reads can be performed to both Bank 0 and Bank 1 through Data Port 0 and Data Port 1. Most importantly, a 32-bit read to one bank 201 can be performed while a 32-bit write is being performed to the other bank.

Figure 3:
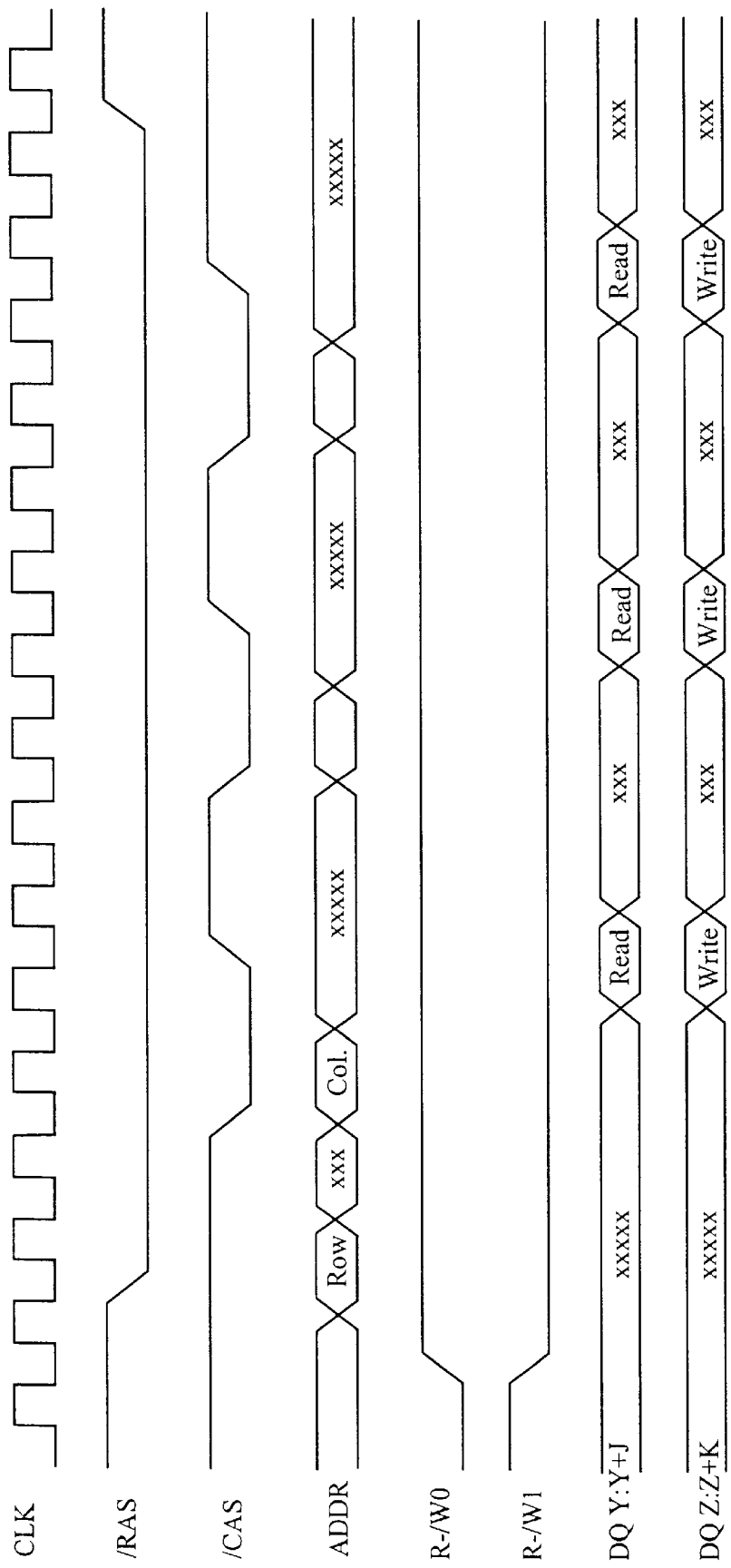
FIG. 3 is a conceptual timing diagram illustrating the operation of a selected data access of the memory shown in FIG. 2.

FIG. 3 is a conceptual timing diagram illustrating an exemplary /RAS cycle during the operation of memory 200. In this example, a read is being performed to Bank 0 and a write is being performed to Bank 1. A synchronous embodiment of memory 200 is assumed, with timing controlled by a master clock CLK and an active clock enable signal (not shown). Asynchronous embodiments operate in a similar fashion with regards to the remaining signals shown in FIG. 3. For exemplary purposes, one random access and two page accesses are shown, although the number of accesses will vary in actual implementations. It should be noted that /CAS cycling and/or column address incrementation during paging may be effectuated externally or internally. In the preferred embodiment, both banks are either in a random access mode or both banks are in a page mode simultaneously.

During the period when RAS is high, memory 200 is in precharge, as is known in the art. Generally, during precharge, various nodes of the dynamic circuitry, of which memory device 200 is preferably constructed, are brought to selected voltages, and most importantly, the sense amplifiers are equalized.

In FIG. 3, the Bank 0 read-write control bit, R-/W0 is set high to effectuate the BANK 0 read and the Bank 1 read-write control bit R-/W1 is set low to effectuate the Bank 1 write.

With the falling edge of /RAS, a row address is presented at the address port, latched-in, and presented to the row decoders 205 of both banks to select corresponding rows therein. Further, with the transition of /RAS from logic high to logic low, memory 200 enters the active cycle. Among other things, the sense amplifiers are now prepared to transfer data and all dynamic circuitry which had been shut-down during the inactive (precharge) cycle to save power are re-activated. After a short delay for set-up, at least the first column address is input and latched-in with falling edge of /CAS.

Once the row and column addresses are input and decoded, the desired accesses the BANK 0 read can be made through Data Port 0 (pins DQ Y:Y+J) and the BANK 1 write through Data Port 1 (pins DQ Z:Z+K). In the present example, where the total width of the data I/O is 64 bits, then 32 bits are read through Data Port 0, comprised of pins DQ 0:31, and 32 bits are written through Data Port 1, comprised of pins DQ 32:63.

It should be noted that /RAS in combination with the read-write control signals R-/W0 and R-/W1 can be presented and decoded to select the type of access being performed for a given bank. For example, if the addresses are presented to the address port in precharge and the corresponding read-write signal R-/W is low during precharge, a write operation is performed to the bank is the active cycle. Similarly, if addresses are presented during precharge and the corresponding read-write signal is high in precharge, a read operation is performed to the bank in the active cycle. This feature of the present invention will be further described in conjunction with the embodiment of FIGS. 4 and 5.

The ability to access multiple banks independently through multiple (split) data ports has substantial advantages over the prior art. Among other things, the CPU and/or core logic can directly work with smaller words of data while still being able to access full data words (i.e. as wide as the entire data I/O) when higher bandwidth is required. When working with smaller words, the ability to simultaneously read and write to multiple banks can increase operational efficiency and assist in conserving clock cycles, especially in high performance, high speed processing systems.

Multiple bank-multiple port memories according to the present invention can also be advantageously employed in multiprocessing systems and servers. In these applications, one data port can be used to exchange data with a given external device or system while a second port is simultaneously used for a read or write with a second device or system.

In the embodiment of system 100 shown in FIG. 1A, memories embodying the principles of the present invention may be used in the construction of either system memory 105 or frame buffer 108. For example, when used in frame buffer 108 one bank and the corresponding data port can be used to support screen refresh while the other bank and corresponding data port receive update data from core logic 103. When the update is complete, the banks and respective data ports can receive roles.

In additional embodiments, one bank and one port may be used as the frame buffer and another bank used as texture memory. This configuration is particularly advantageous in 3-dimensional rendering and other advanced display systems. Further, multiple bank-multiple data port memories such as memory 200 can advantageously employed in systems using unified memories, such as the embodiment of system 100 shown in FIG. 1B. In this case, one data port/bank of one or more devices is used for screen refresh and the other data port used for display data update by the CPU. Once data update is completed, the banks and ports again reverse roles. Simultaneous reads and writes through both ports of a given device may be performed, such as during traditional system memory operations.

Figure 4:
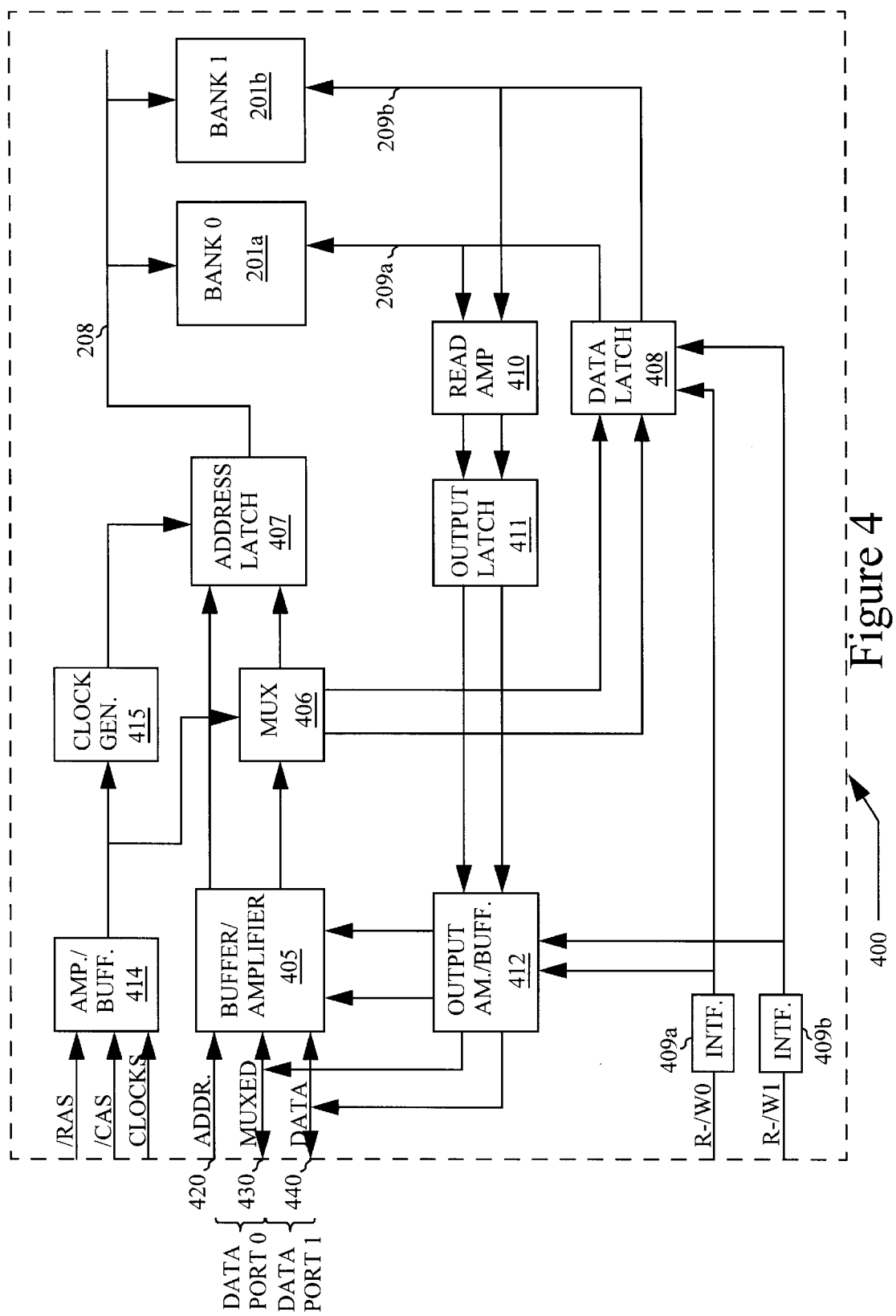
FIG. 4 is a more detailed functional block diagram of a memory subsystem according to a second embodiment of the principles of the present invention.

FIG. 4 shows one possible embodiment of the principles of the present invention in a low-pin count (multiplexed address/data port) memory system 400. A complete description of a basic low pin count memory device is found in allowed and co-assigned U.S. patent application Ser. No. 08/521,867, entitled LOW PIN COUNT—WIDE MEMORY DEVICES AND SYSTEMS AND METHODS USING THE SAME, attorney docket no. 2836-P036US, filed Aug. 31, 1995, now U.S. Pat. No. 5,537,353 and incorporated herein by reference. A description of the principles of the present embodiment as specifically applied to a low-pin count DRAM is as follows.

In the illustrated embodiment, memory 400 is based around at least two banks 201, as was found in the embodiment of FIG. 2. More than two banks could be used in alternate embodiments. The preferred structure and operation of each of bank is essentially the same as described above in conjunction with FIG. 2 and thus for brevity and clarity, their description will not be repeated here.

In the low pint count embodiment of FIG. 4, memory 400 includes a selected number of I/O pins 420 which are dedicated for receiving addresses, a second selected number of pins 430 which are multiplexed for either inputting addresses or inputting and outputting data, and a third selected number of pins 440 dedicated for inputting and outputting data. The process of inputting and outputting data and addresses will be further discussed below; however, it should be noted at this point that addresses and data are selectively presented to the multiplexed pins 430 under control of core (glue) logic, such as core logic 103 of system 100. Generally, conventional core logic chips can bridge address and data buses and switch a given port in the system, such as multiplexed pins 430, to either the address path or the data path of either CPU local bus 102 or PCI bus 116. It should be noted that the "frame buffer" can also use the address/data multiplexing scheme, provided the memory controller embedded in the graphics controller is designed suitably to perform such switching.

While in the illustrated embodiment only some of the address pins are multiplexed, and some are dedicated, in alternative embodiments all the pins receiving addresses may be multiplexed to also receive data. The same is true for those pins dedicated for receiving data; in alternate embodiments all pins exchanging data may be multiplexed to also receive addresses. In the preferred embodiment, some address pins are dedicated in order to be available to be used for other functions. For example, the pins receiving the high order address bits may be non-multiplexed and also used for bank or byte select operations.

I/O pins 420, 430, 440 are coupled to an input buffer/amplifier 407. Addresses received on a dedicated address pins 420 are coupled directly to an address latch 408. Addresses received on multiplexed pins 430 are selectively passed to address latch 408 through a multiplexer 409.

In one embodiment, row and column addresses presented at pins 420 and 430 may be word serially received (i.e., row address bits received as a word and column address bits received subsequently as a separate word) from a conventional multiplexed address bus. In this case, address latch 408 may be a conventional 3-phased address latch system which would pipeline the initially received row addresses to row decoder 405 and the subsequently received column addresses to column decoder 403. Alternatively, a non-multiplexed addressing system may be employed in which the row and column address bits for at least the ransom access are presented and latched in simultaneously.

As discussed above, according to the principles of the present invention, the pins receiving data (multiplexed and dedicated) are split into two groups or data ports, with one group supporting accesses to Bank 0 and the other accesses to Bank 1. Reading and writing to Banks 0 and 1 are again controlled by an independent read-write control signals, R-/W0 and R-/W1 respectively. The partitioning of the pins, including the allocation of multiplexed and nonmultiplexed pins, if any, between ports is a matter of choice. Preferably, for a two bank embodiment, the pins are split evenly.

In the illustrated embodiment with two independent banks, each read-write control signal controls an independent read-write path. As with the embodiment of FIG. 2, simultaneous reads and writes can be performed to both banks using the entire width of the data I/O. The split data port and corresponding independent data paths allow for a write to performed to one of the banks at the same time a read is being performed to the other.

During a write through one or both of the data ports, data received on the corresponding allocated multiplexed pins 430 and/or dedicated data pins 440 are switched by multiplexer 406 to a data latch 408. Data latch 410 transfers the data being written to column decoder of the desired bank 201a or 201b (FIG. 2) in response to the states of the read-write signals R-/W0 and R-/W1 input through interfaces 409a and 409b respectively. For a write to a selected bank 210, the corresponding read-write signal R-/W0 or R-/W1 is set low. Interfaces 409 may be for example TTL, CMOS or other I/O standard interface circuitry.

During a data read data output from the sense amplifiers/column decoder circuitry of the bank 201a and/or 201b (FIG. 2) being read from are passed first to a read amplifier 410 and then to an output latch 411. Data from output latch 411 is then passed through an output amplifier/buffer 412 during multiplexed pins 420 and/or data pins 440 allocated to the bank or banks being read from. Preferably output data bypasses input buffer/amplifier 407. Output amplifier/buffer is preferably also controlled by read-write control signals R-/W0 and R-/W1, with the corresponding read-write control signal set high to effectuate a read to the selected bank.

Figure 5:
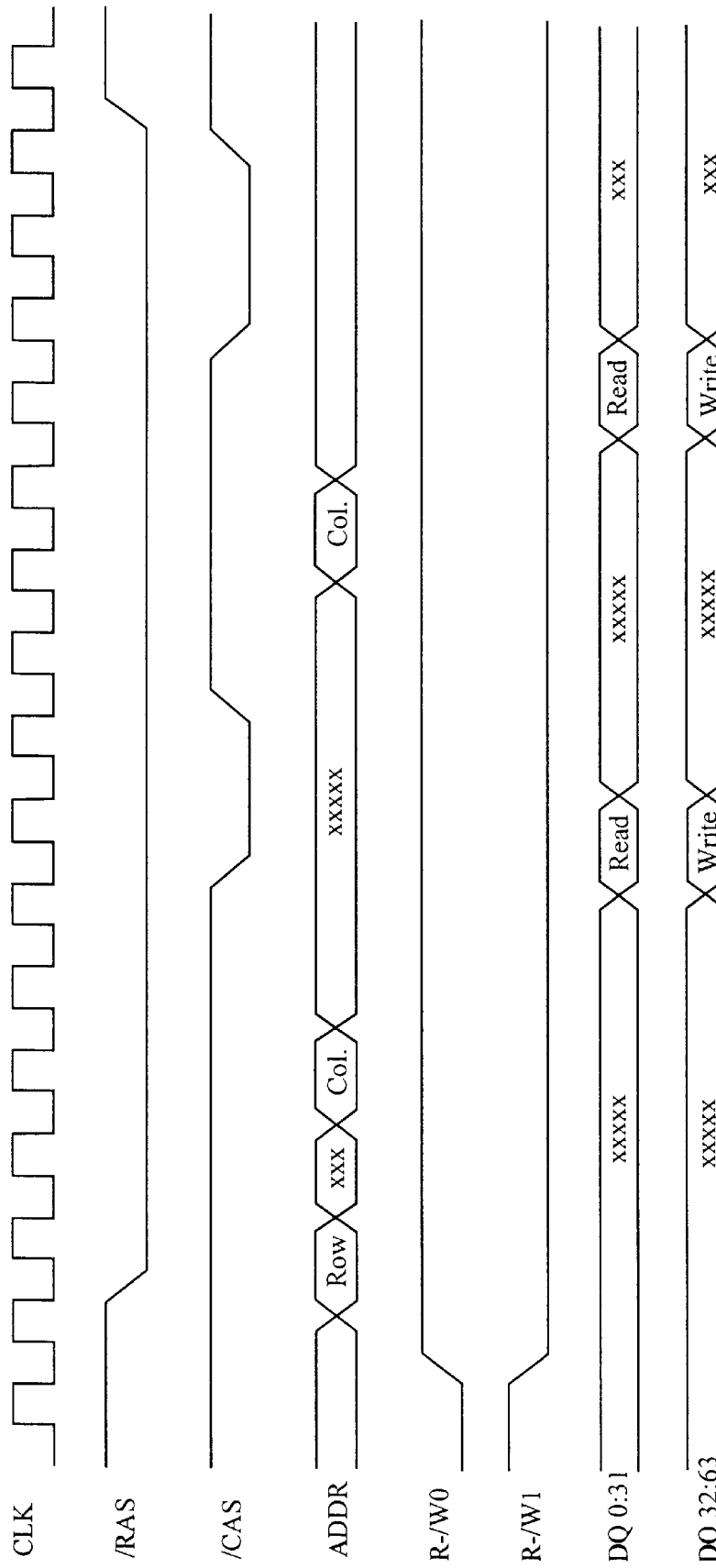
FIG. 5 is a conceptual timing diagram depicting exemplary data access cycles from the operation of the memory shown in FIG. 4.

FIG. 5 is a timing diagram illustrating the preferred operation of memory 400 according to the principles of the present invention. For discussion purposes a write to Bank 0 and a read from Bank 1 are assumed for discussion. One random access and one page access are depicted for reference. As shown, addresses are received during this period when /RAS is inactive (high) on both the address dedicated pins 420 and the multiplexed address/data pins 430. Consequently, during /RAS high, MUX 406 switches to couple multiplexed pins 430 to address latch 407. In the preferred embodiment, row address bits are first received and passed to address latch 407 for pipelining to row decoder 402. After a don't care period, the column address bits presented on pins 430 and 440 are received and pipelined through address latch 407 to column decoder 404. In a non-multiplexed addressing system, row and column bits would be received at once.

As discussed above, the setting of the read-write signals R-/W0 and R-/W1 during precharge or after precharge can advantageously decoded to determine the operation to be performed in the active cycle.

On the falling edge of /RAS, memory 200 enters an active cycle. For the write to Bank 0, multiplexer 406 switches such that data received at the multiplexed input pins 430 and/or the data dedicated pins 440 allocated to Bank 0 are coupled to data latch 408 for presentation to the Bank 0 column decoder, as controlled by the read/write bit R-/W0. The output amplifiers—buffers of block 412 which drive the pins allocated to Bank 0 during a read are in a tri-state (high impedance) condition.

Data is read from Bank 1 through the path comprising the sense amps and column decoder of the bank (FIG. 2), read amplifier 410, output latch 411 and the output amplifiers—buffers driving the pins allocated to Bank 1 412.

In the illustrated embodiment, /CAS controls the activation and deactivation of the column decoders of Bank 0 and Bank 1, and thus the ultimate timing of the exchange of data with the corresponding cell arrays. In the preferred embodiment, the input of row and column addresses, even from a multiplexed bus, is performed independent of a column address strobe (/CAS). In alternative embodiments, /CAS may be used to control the timing and latching-in to address latch 407 of the column addresses appearing on address pins 420 and multiplexed pins 430 during each inactive cycle.

With the rising edge of /RAS, memory 400 leaves the active state, enters the next inactive cycle and waits for a new set of row and column addresses.

The scheme works equally well, as an alternate embodiment, in a synchronous mode with master clock or in a traditional DRAM timing scheme wherein the row address is strobed on the falling edge as RAS and the column address is strobed on the falling edge of CAS.

Although the present invention and its advantages have been descried in detail, it should be understood that various changes, substitutions and alterations can be made herein without departing from the spirit and scope of the invention as defined by the appended claims.

What is claimed is:

1. A memory comprising:
   a first memory bank; a second memory bank; and
   a plurality of data input/output terminals, a first subset of said plurality of data input/output terminals for accessing said first memory bank and a second subset of said plurality of data input/output terminals for accessing said second memory bank; and
   inputs for receiving first and second read-write control signals, said first read-write control signal controlling accesses to said first memory bank, and said second read-write control signal controlling accesses to said second memory bank.

2. The memory of claim 1 wherein each of said first memory bank and said second memory bank comprises:
   an array of rows and columns of memory cells; and
   addressing circuitry for selecting memory cells of said array of rows and columns of memory cells for access in response to address bits.

3. The memory of claim 2 and further comprising an address port for receiving addresses for accessing said first and second memory banks.

4. The memory of claim 3 wherein an address received at said address port addresses both said first and second banks memory.

5. The memory of claim 2 wherein at least one of said plurality of data input/output terminals is multiplexed to further receive an address bit in an addressing mode for addressing at least one of said first and second memory banks.

6. The memory of claim 2 wherein said array of memory cells comprises an array of dynamic random access memory cells.

7. A memory comprising:
   a plurality of memory banks, each comprising an array of memory cells and addressing circuitry for selecting cells within said array for access in response to a received address, a type of access to a said bank selected in response to a read-write bit received at a control port of said memory; and
   a plurality of terminals for accessing data from addressed ones of said cells, a selected subset of said terminals for exchanging data with a corresponding one of said memory banks, and wherein said control port includes a plurality of terminals for receiving a plurality of read-write control bits, each of said plurality of read-write control bits controlling access type selection for a corresponding one of said memory banks.

8. The memory of claim 7 wherein said type of access is selected from a group consisting of read and write accesses.

9. The memory of claim 7 wherein addresses are input through a plurality of terminals during an addressing mode.

10. The memory of claim 9 wherein at least one of said plurality of terminals for inputting addresses comprises a selected one of said plurality of terminals for accessing data.

11. The memory of claim 7 wherein timing and control of each of said memory banks is implemented by a single set of timing and control signals received through said control port.

12. The memory of claim 7 wherein timing and control of each of said memory banks is implemented by independent sets of timing and control signals received though said control port.

13. The memory of claim 7 wherein said memory is fabricated on a single chip.

14. An integrated circuit comprising:
a first memory bank including an array of dynamic random access memory cells and decoder circuitry for selecting at least one of said cells in said array for access in response to at least one address bit;
a second memory bank including an array of dynamic random access memory cells and decoder circuitry for selecting at least one of said cells in said array for access in response to at least one address bit; and
input/output circuitry coupled to said first and second memory banks comprising:
a plurality of address terminals for receiving address bits addressing at least one of said memory banks;
a plurality of data terminals, first selected ones of said plurality of data terminals for exchanging data with addressed ones of said cells of said first memory bank and second memory selected ones of said data terminals for exchanging data with addressed ones of said cells of said second bank;
a first terminal for receiving a control signal controlling reading and writing with said first memory bank; and
a second terminal for receiving a control signal controlling reading and writing with said second memory bank.

15. The integrated circuit of claim 14 wherein at least one of said plurality of data terminals comprises a multiplexed terminal receiving an address bit during addressing of at least one said memory bank and exchanging a data bit during data accessing of at least one of said memory banks.

16. The integrated circuit of claim 14 wherein at least one of said plurality of address terminals comprises a multiplexed terminal receiving an address bit during addressing of at least one said bank and exchanging a data bit during data accessing of at least one said memory bank.

17. The integrated circuit of claim 14 wherein each said memory bank comprises a DRAM memory bank, timing and control of said first and second memory banks implemented by a single set of DRAM control signals.

18. The integrated circuit of claim 17 wherein said set of DRAM control signals include a row address strobe and a column address strobe.

19. The integrated circuit of claim 14 wherein each said memory bank comprises a DRAM memory bank, timing and control of said first and second memory banks implemented by separate sets of DRAM control signals.

20. The integrated circuit of claim 18 wherein addresses are received through said plurality of address terminals during a precharge cycle controlled by said row address strobe.

21. A method of operating a memory including first and second memory banks and a plurality of data input/output terminals, comprising the steps of:
accessing the first memory bank through a first subset of the plurality of data input/output terminals; and
substantially simultaneously accessing the second memory bank through a second subset of the plurality of data input/output terminals, and wherein the first memory bank access is controlled by a first read-write signal, and the second memory bank access is controlled by a second read-write signal.

22. The method of claim 21 wherein said step of accessing the first bank comprises a step of reading and said step of accessing the second bank comprises a step of writing.

* * * * *